United States Patent [19]

Ikoma et al.

[11] Patent Number: 4,935,303
[45] Date of Patent: Jun. 19, 1990

[54] NOVEL DIAMOND-LIKE CARBON FILM AND PROCESS FOR THE PRODUCTION THEREOF

[75] Inventors: Keiko Ikoma, Yokohama; Noriko Kurihara, Kawasaki; Keiji Hirabayashi, Tokyo; Yasushi Taniguchi; Kenji Ando, both of Kawasaki; Susumu Ito, Tokyo, all of Japan

[73] Assignee: Canon Kabushiki Kaisha, Tokyo, Japan

[21] Appl. No.: 257,529

[22] Filed: Oct. 14, 1988

[30] Foreign Application Priority Data

Oct. 15, 1987 [JP] Japan .................. 62-258326

[51] Int. Cl.$^5$ .................. B32B 9/00; B05D 3/06
[52] U.S. Cl. .................. 428/408; 427/38; 427/45.1
[58] Field of Search .................. 427/38, 45.1; 428/408

[56] References Cited

FOREIGN PATENT DOCUMENTS 59-63732 4/1984 Japan .
62-027575 2/1987 Japan .................. 427/45.1

OTHER PUBLICATIONS

Kawarada et al., Japanese Journal of Applied Physics, vol. 26, No. 6, Jun. 1987, pp. 4032–4034.

*Primary Examiner*—Stanley Silverman
*Attorney, Agent, or Firm*—Fitzpatrick, Cella Harper & Scinto

[57] ABSTRACT

A general-purpose novel diamond-like carbon film (DLC film) and its manufacture, and the DLC film is characterized by the following items (i) to (iv); (i) the film structure contains mainly diamond crystalline phases, and has a hydrogen content of 20 atomic %, the presence of diamond crystalline phases is confirmed by analysis by the electron diffraction method, and the diffraction peak appears at $2\theta=43.9$ by analysis by the X-ray diffraction method; (ii) the density is 1.8 g/cm$^3$ or over; (iii) the film surface is smooth and excellent in etching resistance; and (iv) the film is chemically stable and structurally stable, and these stabilities are not deteriorated under high temperature conditions.

4 Claims, 6 Drawing Sheets

1 μm

1 μm

1 μm

NOVEL DIAMOND-LIKE CARBON FILM AND PROCESS FOR THE PRODUCTION THEREOF

FIELD OF THE INVENTION

The present invention relates to a novel diamond-like carbon film distinguished objectively from conventional diamond-like carbon films, and to a process for the production thereof.

BACKGROUND OF THE INVENTION

Heretofore, a variety of diamond thin films and diamond-like carbon films have been known, and they are expected to be used as electrically insulating films, protective films, constituent members for electronic devices, and optical thin films. Some of them are already practically used as a speaker diaphragm, etc. As the method of producing such diamond thin films and diamond-like carbon films, various methods of synthesizing them from a vapor phase are suggested, and typical examples are:

(1) An ion beam deposition method (Japanese Patent Application Laid-Open No. 127298/1985); an ion beam spattering method (Japanese Patent Application Laid-Open No. 106513/1982); an RF spattering method (Japanese Patent Application Laid-Open No. 53255/1988); an RF glow discharge method (J. Fink et al., Solid State Comm. 47 (1983) 687); and a DC discharge method (Japanese Patent Application Laid-Open No. 145995/1985); and (2) A microwave plasma CVD method (Japanese Patent Publication No. 3320/1986); a hot filament CVD method (Japanese Patent Application Laid-Open No. 91100/1983); and a hot plasma CVD method (Japanese Patent Application Laid-Open No. 158195/1987).

Any of the methods in (1) above generally gives a diamond-like carbon film high in amorphousness and having a smooth surface. However, any of the diamond-like carbon films obtained has problems given below.

The ion beam deposition method is a method wherein methane gas or the like is passed into an ion gun to form a carbon-containing ion beam, and the ion beam is struck to a substrate to thereby form a film. Although some of the films obtained by this method are detected as crystalline by the electron diffraction, generally the obtained films including a film called an i-c film are high in amorphousness and good in surface flatness. However, for these films, their characteristics are dependent on the properties of the amorphous parts as contained therein and they are still problematic with the points that the optical band gap is narrow, and the electrical resistivity is low, the film is far inferior to natural diamond.

The ion beam spattering method is a method wherein graphite is used as a target, and the target is spattered with a spattering gas in the form of an ion beam activated by an ion gun to form a film. The RF spattering method is a method wherein graphite is used as a target, and the target is spattered with a spattering gas activated with high-frequency electric energy to form a film. In any of these methods, although films having a low hydrogen content and high in hardness can be obtained, the films are poor in film properties including electric resistance and optical band gap, and because of this, they are not practically applicable.

The RF glow discharge method applies high-frequency electric energy to form a plasma, and the DC discharge method applies a direct current voltage to form a plasma, whereby a carbon-containing gas is decomposed to form a film.

By these methods, there may be obtained such films including a film called an a-C:H film which are amorphous and high in the H-content. For these films, there are advantages with respect to certain points that the optical band gap is wide and the electric resistance is high, but they are poor particularly in hardness and refractive index, and because of this, they are not practically applicable.

In addition to the above problems, the methods in (1) above are accompanied by the following other problems. That is, in any of these methods, the resulting films will be such that the number of carbon atoms per unit volume is generally small, even in the case of an a-C:H film not containing a long chain polymer structure of $-(CH_2-)_{n'}$, the density is undesirably small, and lacks stability particularly with respect to the etching resistance. In the methods mentioned in (1) above, the hydrogen content in the resulting film can be adjusted by controlling the substrate temperature (D. R. Mckenzie et al., Thin Solid Films 108 (1983) 247), or by controlling the substrate bias electric potential by the kinetic energy of the ion species involved in the film-formation (K. Yamamoto et al., Jpn. J. Appln. Phys. 27 (1988) 1415), or by controlling the self-bias electric potential, or by controlling with an acceleration voltage (C. Weissmantel et al., Thin Solid Films 96 (1982) 31). However, if the H-content in the film is lowered, many cases, without increasing diamond phases, result in increases in the number of $SP_2$ hybrid carbon, the number of graphite structures, and the size of the conjugated system, leading to such problems that the optical band gap decreases, and the electric resistance lowers.

Further, in the case where the conventional diamond-like carbon film is annealed, it is gradually dehydrogenated to cause the film structure to change, whereby the film quality is lowered disadvantageously. In this case, there is another problem that graphite structures appear or increase in the resulting film thereby lowering not only its electric properties but also its stabilities such as etching resistance (B. Discheler et al., Solid State Comm. 48 (1983) 105, and Masahata et al., 2nd Diamond Symposium Advance Report (1987), page 7).

With respect to the methods mentioned in (2) above, it is generally possible for any of the methods to provide a diamond polycrystalline film that contains a slight amount of amorphous components. However, the films thus obtained are accompanied by problems as mentioned below.

That is, the microwave plasma CVD method is a method wherein a raw material gas is decomposed by a microwave plasma to cause the formation of a film. According to this method, because of electrodeless discharge, a film containing less impurities can be obtained, but because the film is formed with the substrate temperature kept as high as 800° C. or over, the resulting film will become such that comprised diamond particles of about 10 μm in size being scattered on a substrate or a so-called crystalline film comprised of such particles being continuously linked. The thus obtained film, if formed, lacks homogeneity and is poor in surface flatness, and because of this, it is not practically usable as a member.

The hot filament CVD method is a method wherein a carbon-containing gas is decomposed by way of a thermion releasing means. In comparison to the microwave plasma CVD method mentioned above, this method has an advantage that a film is possible to be formed on a large area substrate, but since the film formation is carried out under more or less around the same film forming conditions as those in the microwave CVD method, similarly to the film obtained by the microwave plasma CVD, the film thus obtained is not practically usable.

The hot plasma CVD method is a method wherein a film is formed by using a high-temperature plasma at a gas temperature of 1700 K or over. Since the film formation by this method is carried out under higher temperature and higher pressure conditions than those in the microwave plasma CVD method or in the hot filament method, a quality diamond of less crystal defects may be formed at a high speed, but the resulting film will become such that comprises diamond particles of larger sizes than those in the case of the microwave plasma CVD method or the hot filament CVD method, and such diamond particles being scattered on a substrate or being continuously linked, and because of this, it is not practically usable.

As another method of producing a diamond film or a diamond-like carbon film, a microwave plasma CVD method is suggested wherein a magnetic field is applied (see Japanese Patent Application Laid-Open No. 103098/1985 or Japanese Patent Application Laid-Open No. 36200/1986).

In Japanese Patent Application Laid-Open No. 103098/1985, although it is described that a quality diamond film may be obtained according to the method disclosed therein, the conditions are such that the substrate temperature is to be 700° to 900° C., and the film-forming pressure is to be $10^{-3}$ to $10^{-1}$ Torr. However, if the film-forming pressure condition is made so low, and the substrate temperature is made so high, for example, the gas molecular density hardly reaches such an extent that allows a film to be formed, and therefore it is extremely difficult to stably obtain a desired diamond film as expected. Japanese Patent Application Laid-Open No. 36200/1986 describes that a diamond film may be formed at a high deposition rate. However, according to the method disclosed therein, the substrate is kept at a elevated temperature, and the pressure condition is made so high as 50 Torr. In this connection, a product comprised of a diamond should be obtained in accordance with this method, the product will be such that comprises diamond particles being scattered on a substrate or being continuously linked. Because of this, it is extremely difficult to stable obtain a practically applicable diamond film having a desired surface flatness.

Now, for an electrically insulating film or a protective film to be used in electronic devices, it is required for the surface of the film to be desirably even. In addition to this, particularly in the case where such film is used to protect a radiating body in electric or electronic devices which will be heated with passage of an electric current or light irradiation or in the case such film is used as a protective film to protect a constituent member in said devices from abrading upon contact with other member or certain materials, it is required for such film to have a desired heat stability, a desired etching resistance and a desired chemical stability represented by non-reactiveness with organometals, acids, alkalis, etc. However, there has not yet realized any desirable diamond-like carbon film which totally satisfies the above requirements, which has a desired surface flatness, and which is practically applicable.

SUMMARY OF THE INVENTION

Taking the above problems into consideration, the present invention has been completed, and the major object of the present invention is to provide a diamond-like carbon film which satisfies the above requirements, which is almost impossible to provide by conventional methods, and which is good in surface flatness, and a process of producing the same.

Another object of the present invention is to provide a film which is excellent in chemical stability, and resistant to etching, and whose chemical and structural stability are not deteriorated even at high temperature conditions, and a process of producing the same efficiently.

Still another object of the present invention is to provide a diamond-like carbon film which can be satisfactorily used as a protective member or an electrically insulating member for elements of various electronic devices, and also as a mechanical protective member for a thermal head, a magnetic head, a bearing, and the like, and a process of producing the same.

Still another object of the present invention is to provide a process capable of efficiently producing the above-mentioned diamond-like carbon film through a magnetized microwave plasma CVD method wherein a magnetic field is applied.

DESCRIPTION OF THE INVENTION

Figure 1:
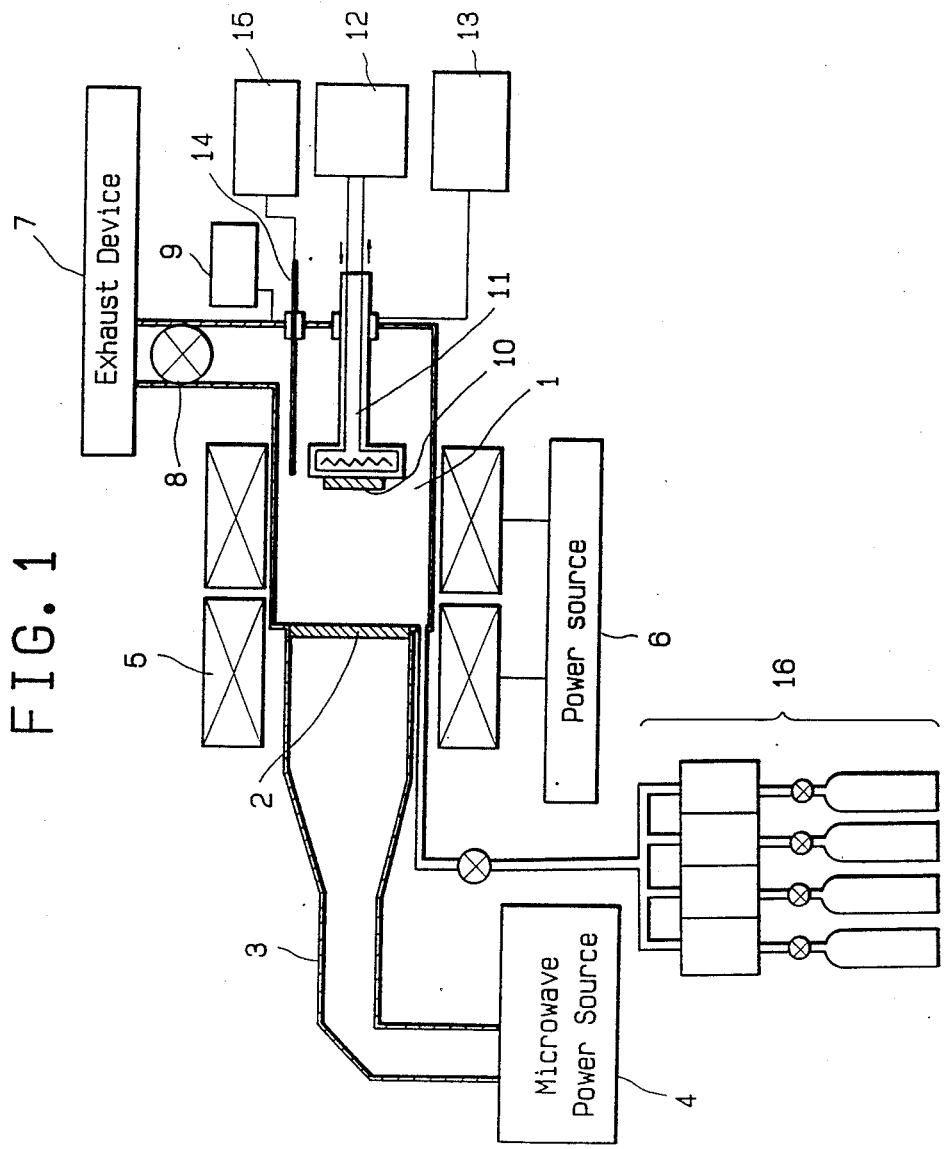
FIG. 1 is a schematic view of an apparatus used in an embodiment of the present invention.

The present invention is to attain the above objects, and provides a novel general-purpose diamond-like carbon film (hereinafter referred to as "DLC film"), and a process of producing the same.

The DLC film provided by the present invention is characterized, for example, in that (i) the film structure is mainly composed of diamond crystalline phases, hydrogen is contained in an amount of about 20 atomic %, the presence of the diamond crystalline phases is confirmed by the analysis of the electron beam diffraction method, and the diffraction peak is observed at $2\theta = 43.9$ by the analysis by the electron beam diffraction method, (ii) the density is 1.8 g/cm$^3$ or over, (iii) the film surface is desirably even and excellent in resistance to etching, and (iv) the film is chemically stable, and structurally stable, and these stabilities are not deteriorated even at high temperature conditions.

The DLC film(diamond-like carbon film) to be provided according to the present invention may be produced in accordance with a process of forming a plasma based on a raw material gas capable of supplying carbon atoms to be the constituents of said DLC film to be formed in the plasma-forming space of a film-forming chamber by applying magnetic fields and at the same time, microwave energy into said plasma-forming space containing said raw material gas to thereby case the formation of said DLC film; wherein said plasma contains at least $C_2$ active species and CH active species, and a substrate on which said DLC film is to be formed is placed within said plasma in which the ratio between the plasma emission spectrum strength $I_{C2}$ due to said $C_2$ active species and the plasma emission spectrum strength $I_{CH}$ due to said CH active species being controlled to be $5 \geq I_{C2}/I_{CH} \geq 0.05$.

In a preferred embodiment, said process is practiced using an appropriate apparatus comprising a substantially enclosed deposition chamber having a plasma-forming space in which a substrate on which a film is to be formed is placed on a substrate holder; a microwave introducing window serving to apply a microwave energy source transmitted through a waveguide from a microwave power source into said plasma-forming space which is provided with a side wall of said deposition chamber; electromagnets being provided with the outer face of the circumferential wall of said deposition chamber which serves to apply a magnetic field into said plasma-forming space; a gas feed pipe serving to feed a raw material gas capable of contributing to formation of an objective DLC film on said substrate; and an exhaust pipe being connected to an exhaust apparatus which serves to evacuate said plasma-forming space. Said process using this apparatus is carried out in the following way for example. That is, an appropriate substrate is attached onto the substrate holder being appropriately positioned in the plasma-forming space; a raw material gas capable of supplying carbon atoms to be the constituents of an objective DLC film to be formed is fed through the gas feed pipe into the plasma-forming space; the inner pressure of the plasma-forming space is adjusted to a vacuum of $1 \times 10^{-2}$ to 10 Torr; and magnetic fields are applied through the electromagnets in such a way that the magnetic field intensity at the position of the plasma-forming space adjacent to the microwave introducing window and the magnetic field intensity near the surface of said substrate become high enough or more to satisfy the electron cyclotron resonating conditions (that is, ECR conditions) and at the same time, microwave energy source is applied through the microwave introducing window into the plasma-forming space to form a desired plasma containing at least $C_2$ active species and CH active species, wherein the ratio of the plasma emission spectrum strength $I_{C2}$ due to said $C_2$ active species to the plasma emission spectrum strength $I_{CH}$ due to said CH active species is controlled to be $5 \geq I_{C2}/I_{CH} \geq 0.05$, whereby an objective DLC film is formed on the substrate maintained at a temperature of 350° to 700° C.

The present invention including the above specific DLC film and its manufacture has been completed based on the following findings obtained as a result of repeated experiments by the present inventors.

Taking into consideration the fact that diamond particles can be formed by the conventional microwave CVD method as described above with the substrate temperature kept high under a high pressure, the inventors have investigated the possibility of providing an usable diamond or diamond-like carbon film through experiments.

That is, in the opposite way to the technique in the conventional microwave CVD method described above, the present inventors tried to form a film in such a way that at the time of the film forming, the pressure and the substrate temperature were kept low with magnetic fields and microwave energy applied. More specifically the inventors attempted as follows.

As a film forming apparatus, an apparatus shown in FIG. 1 was used. As a substrate 10, a Si single crystal wafer whose surface was abraded was used. Said substrate 10 was fixed on a substrate holder 11. Then the distance between the substrate 10 and the microwave introducing window 2 was adjusted to be 150 mm. Thereafter, by operating an evacuating apparatus 7, the internal pressure of a plasma producing chamber 1 was made to be about $1 \times 10^{-6}$ Torr. Then a direct current electric power was supplied to a heating controller to heat the substrate 10° to 450° C. $CH_4$ and $H_2$ from a raw gas supplying system were introduced into the plasma producing chamber 1 with the flow rates thereof adjusted respectively by mass flow controllers, and the pressure in the plasma producing chamber was adjusted by controlling a main valve 8 to a prescribed pressure. Then, the electric current values of constant-current power sources 6 of electromagnets 5 were adjusted to apply magnetic fields so that the magnetic field strength at the microwave introducing window 2 near the plasma producing chamber side might be 1300 gausses, and the magnetic field strength near the surface of the substrate 10 might be 875 gausses. Then, the microwave power source is switched on to input microwaves of 2.45 GHz with a prescribed inputting power into the plasma producing chamber. At that time, the substrate temperature was measured by a thermocouple (not shown) placed on the undersurface of the substrate 10 and was controlled to 580° C. Also, at that time, the emission spectra of $C_2$ and CH in the plasma were measured by an optical fiber plasma emission measuring probe 14 placed adjacent the substrate 10 thereby detecting the emission strength ratio of $C_2$ and CH, the detected ratio was compared with the predetermined calibration curve, and the flow ratio of $CH_4$ and $H_2$, the microwave power, the substrate position were suitable changed so that a prescribed $I_{C2}/I_{CH}$ ratio might be secured. The film forming operation was carried out as described above.

The above film forming operation was repeated with the pressure in the plasma producing chamber and $I_{C2}/I_{CH}$ changed as shown in Table 1.

Tests were carried out to confirm whether a film could be formed on the substrate 10, what type of a deposited film is if formed, and whether the deposited film could be suitable to be used in practice, and the results are summarized in Table 1.

As apparent from the results shown in Table 1, it was confirmed experimentally that when the internal pressure of the plasma chamber 1 was in the range of $1 \times 10^{-2}$ Torr to 10 Torr, and the plasma emission spectrum strengths of $C_2$ active species and CH active species of the plasma produced in the plasma producing chamber 1 were such that the plasma emission spectrum intensity $I_{C_2}$ of the $C_2$ active species and the plasma emission spectrum intensity $I_{CH}$ of the CH active species satisfied the formula: $5 \geq I_{C_2}/I_{CH} \geq 0.05$, a diamond-like carbon film could be obtained that had such satisfactory properties that the film structure contained diamond phases, and the film surface was smooth, excellent in resistance to etching, and chemically and structurally stable.

The confirmation of the diamond phases in the film was performed by the known electron beam diffraction method and X-ray diffraction method. The smoothness of the film surface was assessed by the known needle tracer method. The resistance of the film to etching was assessed in such a way that the film was dipped in a 3:5:3 mixture of HF, $HNO_3$, and $CH_3COOH$ for 10 min, then the film surface was observed by an optical microscope, and also the smoothness of the film surface was measured by the needle tracer method.

Figure 10:
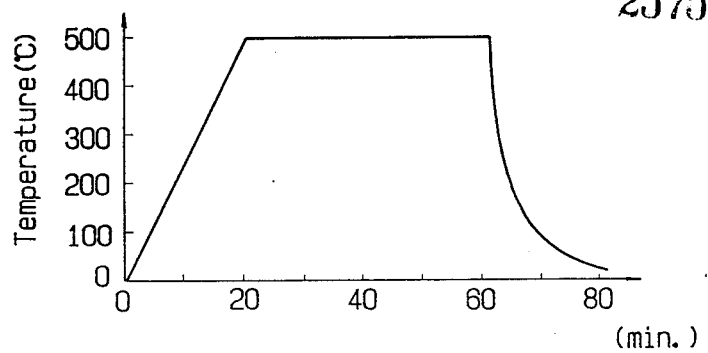
FIG. 10 is a diagram showing the temperature setting of the heating test.

The structural stability of the film was assessed by the method of assessing resistance to etching described above after placing the film sample on a sample supporting table of a tresting vacuum constant temperature bath, then evacuating the bath to $1 \times 10^{-6}$ Torr, heating the sample according to the temperature plasma shown in FIG. 10, and then cooling the sample. The assessment of the properties of the film sample was made by measuring the electric resistivity and the optical band gap.

In the above experiments the substrate temperature at the time of the film formation was 580° C., the magnetic field intensity at the microwave introducing window near the plasma producing chamber side was 1300 gausses, the magnetic field intensity near the substrate surface was 875 gausses, and it was checked whether these parameters had allowance ranges to obtain diamond-like films equivalent to those that were assessed as ◎ and ○. That is, the magnetic field intensity was changed at two points in the above experimental process to repeat the above experiment to produce film samples, and the samples were assessed.

As a result, the following was made clear. That is, it was found that when the magnetic fields were applied to the plasma chamber such that the magnetic field intensity at the microwave introducing window near the plasma producing chamber side might be 875 gausses that satisfied the ECR conditions or higher than those, and the magnetic field intensity near the surface of the substrate might be 875 gausses that satisfied the ECR conditions or higher than those, a desirable diamond-like carbon film could be obtained.

If the magnetic field intensity at the microwave introducing window in the plasma producing chamber near the plasma producing chamber side was up to 875 gausses, the microwave power could not transmitted and absorbed into the plasma, so that the plasma became unstable, or the plasma density near the surface of the substrate lowered, often leading to failure of the formation of a film.

Also even if the magnetic field intensity at the microwave introducing window near the plasma producing chamber side was down to 875 gausses, when the magnetic field intensity near the surface of the substrate was up to 875 gausses that satisfied the ECR conditions, the hydrogen content in the film increased to lower the film density, or the graphite structures increased, leading to problems such as deterioration of properties such as electric resistivity, optical band gap, and etching resistance.

It was found that in order to allow the $C_2$ active species and the CH active species for forming a desired diamond-like carbon film to satisfy the above formula: $5 \geq I_{C_2}/I_{CH} \geq 0.05$ near the substrate surface, an input power of microwaves into the plasma producing chamber in parallel with the magnetic field intensity and the pressure in the plasma producing chamber was important. It was found that although the input power of the microwaves was suitably determined depending on the scale of the plasma producing chamber, and the relative relationship between the magnetic field intensity and the pressure in the chamber, it was preferable generally in the range of 400 to 2 kW. If the input power of the microwaves is 400 W or below, the production of the precursor that will contribute to the formation of a film from film forming raw gases is not enough thereby lowering the rate of the film formation and also increasing the content of hydrogen in the film formed. If the input power of the microwaves is 2 kW or over, the inputted microwave power will not be absorbed into the plasma in the plasma producing chamber and will act as a reflected power to heat the microwave wave guide and the electromagnets, thereby often damaging them.

The present inventors selected the above parameters and studied the conditions that would result in efficient formation of a desirable diamond-like carbon film on a substrate surface from a precursor that would be produced from film forming raw material gases and would contribute to the film formation. As a result, it was found that the position where the substrate was placed in the plasma producing chamber, and the temperature of the substrate at the time of the film formation were important. That is, it was found that although the position where the substrate was placed depended greatly on the magnetic field intensity and the internal pressure, generally it was desirable to place the substrate at a position 10 to 500 mm away from the microwave introducing window. If the substrate was placed at a position 10 mm or less away from the microwave introducing window, the plasma discharge was liable to be unstable near the substrate surface, in addition thereto, carbon deposited on the microwave introducing window to lower the input of the microwave power through the window into the plasma producing chamber, or that deposit mixed into the deposited film. If the substrate was placed at a position 500 mm or more away from the microwave introducing window, the production of the precursor contributing to the film formation was not took place smoothly near the substrate, the film formation speed became very low, and sometimes the formation of the film would not take place.

With respect to the substrate temperature at the time of the film formation, it was found that although the temperature varied depending on the pressure and the emission strength ratio of the $C_2$ active species and the CH active species near the substrate surface, a desirable diamond-like carbon film was obtained if the temperature was kept in the range of 350° to 700° C.

When the temperature was 350° C. or below, problems arose, for example, a film was not formed, or if a film was formed, the H-content was high and the film was low in density, and the structural stability and the chemical stability under high temperature conditions lowered. On the other hand, if the temperature was 700° C. or above, the produced film contained graphite structures, or the major components of the film were graphite structures, resulting in the formation of a film low in properties such as etching resistance and electric resistivity.

The present invention has been completed on the basis of the above found facts, and the present diamond-like carbon film described above can be formed by suitably selecting the above various parameters in a synthetic and organic manner.

The film forming raw material gas used in the present invention as carbon source may be any gas if it is a carbon-containing gas. Preferable examples thereof include hydrocarbons such as methane, ethane, ethylene, benzene, and toluene, alcohols such as methanol and ethanol, ketones, ethers, amines, carbon monoxide, and carbon dioxide. Hydrocarbons whose hydrogen is partially substituted by halogen, that is, halogenated compounds, such as $CF_4$, $CCl_4$, and $C_2H_2Cl_2$ can also be used.

In order to adjust the emission strength ratio $I_{C2}/I_{CH}$ to a prescribed value, and in order not to allow graphite components to produce in the film, it is desirable to used $H_2$ gas as a diluting gas. Depending on the type of the film forming raw material gas, instead of $H_2$ gas, $H_2O$, $O_2$, HCl, HF gas or the like may be used. These gases including $H_2$ gas can be used as a mixture. Further, to stabilize the discharge, He, Ar, $N_2$ gas or the like may be mixed with them.

As the substrate used for obtaining the present desirable diamond-like carbon film, a metal such as Al, Si, Ti, Hf, Ta, W, and Mo, a carbide such as SiC, WC, TiC, and TaC, a silicide such as $SiO_2$, $Al_2O_3$, and $TiO_2$, and a nitride such as $Si_3N_4$, BN, and TiN can be used selectively. The substrate may be one whose surface has been subjected to surface treatment such as lapping.

In order to perform the process of producing the present diamond-like carbon film, any apparatus can be used if the apparatus can perform the process efficiently. As a preferable apparatus, an apparatus having a construction shown in FIG. 1 can be mentioned.

In FIG. 1, reference numeral 1 indicates a plasma producing chamber. The plasma producing chamber 1 is connected to a microwave waveguide 3 via a microwave introducing window 2. Reference numeral 4 indicates a microwave power source, and microwaves are inputted via the wave guide 3 into the plasma producing chamber 1.

Reference 5 indicate electromagnets placed around the wave guide 3 and the producing chamber 1, and the electric current values of the constant-current power sources 6 are controlled to adjust the magnetic field intensities. Reference numeral 16 indicates a gas supply source that can pass gases through gas introducing pipes into the producing chamber 1.

Reference numeral 7 indicates an evacuating apparatus for evacuating the plasma producing chamber 1, and the internal pressure of the producing chamber 1 is monitored by a vacuum gauge 9 and can be adjusted by a main valve 8. Preferably, the evacuating apparatus 10 is combined with a turbo molecular pump or a diffusion pump and a rotary pump.

A substrate 10 is attached to a substrate holder 11. Reference numeral 12 indicates an auxiliary heater/cooler that is measured by a thermocouple (not shown) placed in a position behind the substrate and is adjusted to a prescribed temperature.

Reference numeral 13 indicates a controlling apparatus for controlling the position of the substrate that can adjust the positions of the substrate holder and an optical fiber 14 to desired positions.

Reference numeral 14 indicates an optical fiber type plasma emission measuring probe that has a directional end face for measuring the plasma emission spectrum near the substrate. To measure the emission spectrum, other than the above method, it is also possible to provide a peep window (not shown) in the plasma producing chamber 1, and the measurement is carried out through the window. Reference numeral 15 indicates a spectroscope for measuring the spectrum of light inputted into the spectroscope via the optical fiber.

Figure 2:
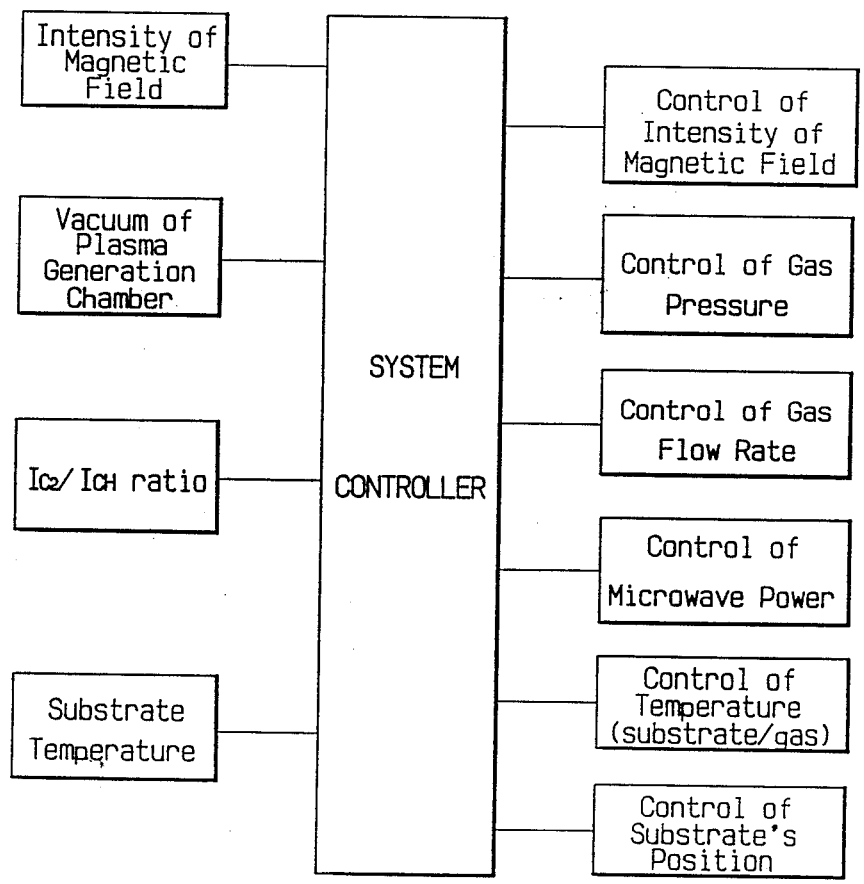
FIG. 2 is a general view showing types of controls by a system controller and input information for the control.

FIG. 2 is a general view showing types of controls by a system controller and input information for the control. As shown, on the basis of the input information (measured values) including the magnetic field intensities, the flow rates of the raw material gases, the degrees of vacuum in the chambers, the $I_{C2}/I_{CH}$ ratio, the support (substrate) temperature, etc. the electromagnetic electric current value control, the gas pressure control, the gas flow rate ratio control, the microwave power control, the temperature control (substrate), and the substrate position control are carried out by the system controller.

DESCRIPTION OF THE PREFERRED EMBODIMENTS

The present invention will now be further described with reference to Examples, but the present invention is not limited by the Examples.

EXAMPLE 1

This example was carried out using the apparatus shown in FIG. 1.

An Si substrate that had been lapped to RMS 30 Å was attached to the substrate holder 11, and was placed in position 130 to 200 mm away from the microwave introducing window. The plasma producing chamber was evacuated to $1 \times 10^{-6}$ Torr by the evacuating apparatus 7, and a mixed gas was passed thereinto from the gas supply source 16 with the $CH_4/H_2$ flow ratio controlled to ¼ by a mass flow controller. The pressure was adjusted to the prescribed pressure as shown in Table 2 by the main valve 8, and the substrate temperature was kept at 300° C. by the heater 12. Then, the electric current values of the electromagnetic power sources 6 were adjusted to generate magnetic fields by the electromagnets 5 so that the magnetic field intensity at the microwave introducing window near the plasma producing chamber side might be 1800 gausses, the magnetic field intensity at a position 80 mm away from the microwave introducing window might be 1300 gausses, and the magnetic field intensity at a position 220 mm away from the microwave introducing window might be 875 gausses. Then, the microwave power source 4 was turned on to input microwaves of 2.45 GHz with a prescribed power to produce plasma.

The substrate temperature was adjusted by the heater/cooler 12 so that the substrate temperature might be a prescribed temperature shown in Table 2.

At that time, the emission spectrum of the plasma was measured by the optical fiber 14 and the spectrometer 15. When the values deviated from the values shown in Table 2, fine adjustment was made automatically to stabilize the plasma to form a film. In this way, it was tried to produce sample Nos. 1 to 9. Consequently, as apparent from Table 2, in the cases of sample Nos. 1 and 2, a film was not formed. With respect to sample Nos. 3 to 9 that produced films, the electron beam diffraction (ED), the X-ray diffraction (XD), the surface smoothness measurement, the H-content measurement in the film, and the density measurement were carried out.

The surface smoothness measurement was carried out by using a known needle tracer type thickness guage. The measurement of the H-content in the film was carried out by chemical analysis using a known burning method. The measurement of the density of the film was carried out by the known solution method.

As a result, the results of the measurement shown in Table 2 were obtained.

From the results shown in Table 2, it was found that the films of sample Nos. 4, 5, 6 and 7 were the desired diamond-like carbon films intended by the invention.

Figure 3:
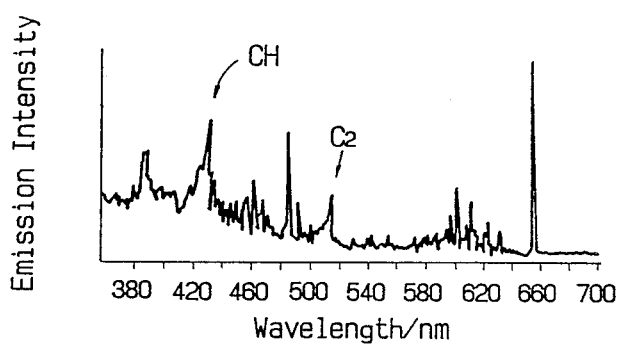
FIG. 3 is the plasma emission spectrum of a diamond-like carbon film obtained by an embodiment of the present invention.

The plasma emission spectrum of sample No. 7 at the time when the film was formed is shown in FIG. 3.

Figure 6:
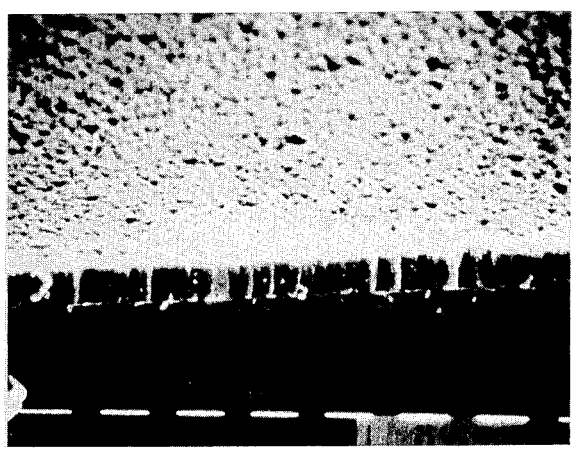
FIG. 6 is an SEM photograph of a diamond-like carbon film obtained in an embodiment of the present invention.
Figure 9:
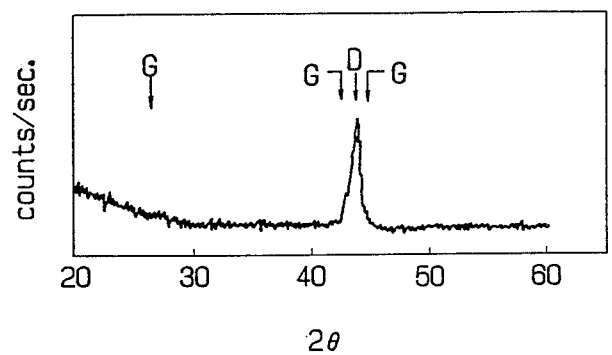
FIG. 9 is an X-ray diffraction spectrum of a diamond-like carbon film obtained in an embodiment of the present invention.

An SEM photograph of the film of sample No. 7 is shown in FIG. 6, and its X-ray diffraction spectrum is shown in FIG. 9.

With respect to the film of sample No. 7, graphite crystals could not be found, and only diamond crystals were found.

With respect to samples Nos. 2, 4 to 7, and 9, an etching resistance test was carried out. The etching test was carried out in such a way that the sample was etched by dipping in an Si etching solution comprising $HF/HNO_3/CH_3COOH$ (3/5/3) for 10 min, and the surface smoothness was measured by using the above needle tracing type thickness gauge.

The results of the measurement are shown in Table 3.

From the results of Table 3, it was found that the films of samples 4 to 7 were excellent in etching resistance.

EXAMPLE 2

The same apparatus as in Example 1 was used and films were formed in the same way as in Example 1. The magnetic field intensity was such that the magnetic field intensity at the microwave introducing window near the plasma producing chamber side was 1500 gausses, and the magnetic field intensity at the substrate was 875 gausses, and the substrate was placed at a position 200 mm away from the introducing window. Microwaves with 950 W were introduced. Other film forming conditions were as shown in Table 4.

In the above manner, it was tried to produce sample Nos. 10 to 17. In the case of sample No. 10, a film could not be formed. With respect to sample Nos. 11 to 17 that formed films, the assessment was made in the same way as in Example 1. The results of the assessment are shown in Table 4.

Figure 4:
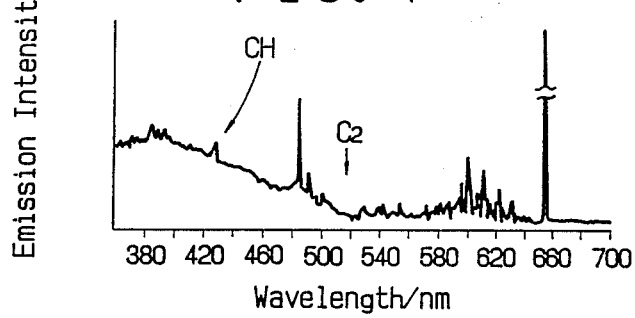
FIGS. 4 and 5 are the plasma emission spectra of products obtained in Comparative Examples.
Figure 7:
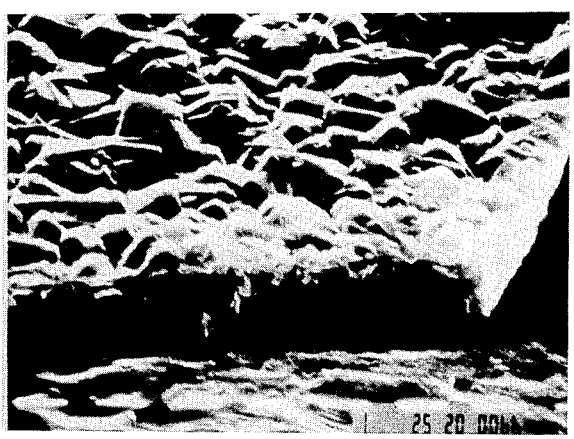
FIGS. 7 and 8 are SEM photographs of products obtained in Comparative Examples.

In FIG. 4, the plasma emission spectrum at the time when the film of sample No. 14 was formed is shown, and in FIG. 7, an SEM photograph of the product is shown.

From the results shown in Table 4, it was found that sample Nos. 12, 13, and 17 were the desired diamond-like carbon films intended by the present invention.

With respect to sample Nos. 11, 12, 13, 15, 16, and 17 whose surface smoothness was good, other respective corresponding samples were prepared, an Al electrode in the shape of a comb was deposited on each of the films by the vacuum deposition method, and the resistivity was measured at room temperature by known means.

Apart from these samples, other samples formed under the same film forming conditions as sample Nos. 11, 12, 13, 15, 16, and 17 were placed on a sample supporting table of a testing vacuum constant temperature bath, the bath was evacuated to $1 \times 10^{-6}$ Torr, and the samples were heated in accordance with the temperature program shown in FIG. 10, and then cooled them. Thereafter the samples were removed from the bath, an Al electrode in the shape of a comb was deposited on each of the samples in the same way as above, and the resistivity was measured at room temperature.

The resistivity of each of the samples immediately after the formation of the film, and the resistivity of each of the samples after the above high temperature durability test are summarized in Table 5.

As apparent from the results shown in Table 5, it was found that sample Nos. 12, 13 and 17 had preferable resistivities, and the resistivities did not change after the heat treatment.

EXAMPLE 3

The same apparatus as in Example 1 was used and films were formed in the same way as in Example 1 to obtain sample Nos. 18 to 20. As a raw gas, benzene/$H_2$ (1/1) was passed, the pressure was adjusted to $5 \times 10^{-2}$ Torr, the conditions of the magnetic field intensities and the substrate position were the same as in Example 2, and the other film forming conditions were as shown in Table 6. As a result, in the case of sample No. 21, a film could not be formed. Other samples that formed films were assessed in the same way as in Example 1, and the results of the assessment are shown in Table 6.

Figure 5:
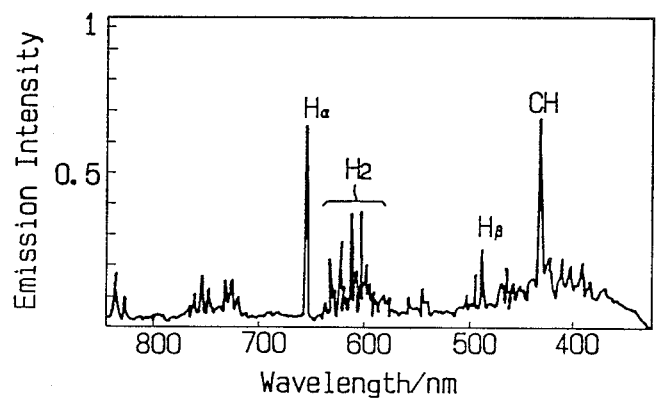
Figure 8:
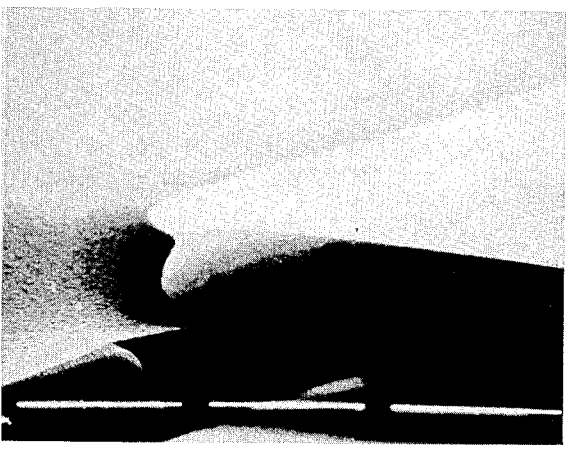

In the case of sample No. 19, the SEM photograph of the product and the plasma emission spectrum were the same as FIG. 3 and FIG. 6. The plasma emission spectrum and the product SEM photograph of sample No. 22 at the time of the film formation are shown in FIG. 5 and FIG. 8.

Figure 11:
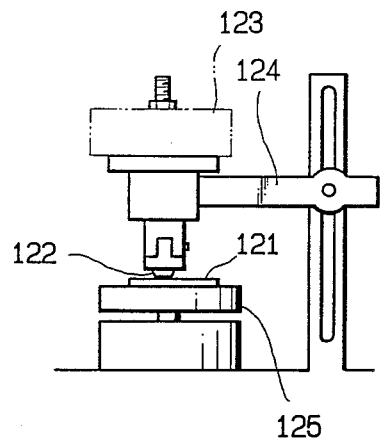
FIG. 11 is an explanatory view of an abrasion testing apparatus.

Under the same conditions as for sample Nos. 18, 19, 20, and 22, a film having a thickness of 8000 Å was formed on each of stainless steel SUS 440 C substrates to prepare sample pieces corresponding to sample Nos. 18, 19, 20, and 22. The obtained sample pieces were subjected to an abrasion test using an abrasion test apparatus shown in FIG. 11. In that case, as shown in FIG. 11, a rotating table 125 on which a sample piece (121) was placed, and a copper penetrator 122 having a diameter of 4 mm that was situated over the rotating table 125 and was connected to a support rod 124 and on which a constant load was applied by a weight 123 were rotated at a certain speed.

As a result, although in the case of sample Nos. 18, and 19, the surface state before the test was almost the same as that after the test, in the case of sample No. 20, the surface state before the test was considerably different from that after the test, and in the case of sample No. 22, the film disappeared.

EXAMPLE 4

The same apparatus as in Example 1 was used and films were formed in the same way as in Example 2 to obtain sample Nos. 23 to 28. As a raw gas, $CHCl_3/H_2$ (⅓) was used, microwaves with 2000 W were introduced, and other film forming conditions were as shown in Table 7.

As a result, in either cases of sample Nos. 27 and 28, the formation of a film was impossible. With respect to sample Nos. 23 to 25 that formed films, the same assessment as in Example 1 was carried out, and the results of the assessment are shown in Table 7.

From the results shown in Table 7, it was found that the films of sample Nos. 23, 24, and 26 were the diamond-like carbon films intended by the invention.

With respect to sample Nos. 23 to 26, the same etching resistant test as in Example 1 was carried out. As a result, although the films of sample Nos. 23, 24 and 26 had good etching resistance, the film of sample No. 25 was etched to an extent that the film was not recognized.

EXAMPLE 5

The conditions other than shown in Table 8 were the same as for sample No. 6 in Example 1 to try to produce sample Nos. 29 to 35.

As a result, in the case of sample No. 29 the formation of a film was impossible. In the case of sample No. 33, the appearance is a film, but actually it was composed of soot. Sample Nos. 30, 31, 32, 34 and 35 that formed films were assessed in the same way as in Example 1, and the results of the assessment are shown in Table 8.

From the results shown in Table 8, it was found that sample Nos. 30, 32, 33, 34, and 35 were the diamond-like carbon films intended by the invention.

TABLE 1

| $I_{C2}/I_{CH}$ inner pressure (Torr) | 0.01 | 0.05 | 0.5 | 1 | 5 | 10 |
|---|---|---|---|---|---|---|
| $10^{-4}$ | x-(1) | x-(1) | x-(1) | x-(2) | x-(2) | x-(2) |
| $10^{-3}$ | x-(1) | x-(1) | Δ-(1) | Δ-(1) | x-(2) | x-(2) |
| $10^{-2}$ | x-(3) | Δ-(2) | ⊚ | ⊚ | Δ-(1) | x-(2) |
| $10^{-1}$ | x-(3) | Δ-(2) | ⊚ | ⊚ | ○ | Δ-(1) |
| 1 | x-(3) | ○ | ⊚ | ⊚ | Δ-(3) | x-(4) |
| 10 | x-(5) | Δ-(4) | ○ | Δ-(3) | x-(4) | x-(4) |
| 100 | x-(5) | x-(5) | Δ-(4) | x-(4) | x-(4) | x-(4) |

⊚: diamond crystal phase is contained in the film structure, the film has a desirably flat surface and has an excellent resistance against etching, it is chemically and structually stable and it has excellent characteristics.
○: fairly inferior to the above film with respect to the characteristics but satisfactorily employable in practical use.
Δ-(1): density is undesirably small, inferior particularly with respect to resistance against etching, and not practically employable.
Δ-(2): presence of a great many pin holes in the film structrue and not practically employable.
Δ-(3): inferior with respect to the characteristics of electric resistance, optical band gap and resistance against etching, and not practically employable.
Δ-(4): the size of a diamond crystal particle becomes too large to worse the surface state.
x-(1): etching often occurs and the deposition rate is extremely slow, and sometimes, no film is formed.
x-(2): under this condition, it is extremely difficult to stably form plasmas and it is extremely difficult to form a film.
x-(3): the deposition rate is extremely slow, particles are formed, and no film is formed.
x-(4): there is formed an undesirable film which is conductive and has an extremely small optical band gap.
x-(5): there are formed diamond particles or there is formed an undesirable product comprising diamond particles being continuously linked which has a significantly rough surface.

TABLE 2

| Sample No. | Intensity of magnetic field near or round the substrate (Gauss) | Inner pressure (Torr) | Microwave power (W) | Substrate temperature (°C.) | $I_{C2}/I_{CH}$ | ED | XD | Surface flatness (RMS Å) | Hydrogen content (atm %) | Density (g/cm³) | Total evaluation |
|---|---|---|---|---|---|---|---|---|---|---|---|
| 1 | 875 | 5 × 10⁴ | 600 | 430 | ~0 | | | no film was formed | | | x |
| 2 | " | 5 × 10⁻³ | 600 | 430 | " | | | no film was formed | | | x |
| 3 | " | 1 × 10⁻² | 700 | 450 | 0.1 | D | amorphous | amorphous and presence of many pin holes | | | Δ |
| 4 | " | 7 × 10⁻² | 750 | 450 | 0.4 | D | amorphous | 100 | 20 | 1.8 | ○ |
| 5 | " | 0.1 | 800 | 470 | 1.0 | D | D | 100 | 12 | 2.0 | ⊚ |
| 6 | 1300 | 0.5 | 2000 | 550 | 0.7 | D | D | 200 | 8 | 2.0 | ⊚ |
| 7 | " | 1 | " | 600 | 0.5 | D | D | 300 | 8 | 2.0 | ⊚ |
| 8 | " | 15 | " | 800 | 0.5 | D | D | 1700 | 4 | 2.4 | Δ |
| 9 | " | 0.5 | 300 | 550 | ~0 | amorphous | amorphous | 300 | 10 | 1.7 | Δ |

Note: Samples Nos. 1, 2, 3, 8 and 9 are all comparative examples.
⊚: Excellent
○: Good
Δ: Inferior
x: Very much inferior or not possible to form a film

TABLE 3

| sample No. | Surface flatness (RMS Å) | |
|---|---|---|
| | Prior to test | after test |
| 2 | 200 | film disappeared |
| 4 | 100 | 250 |
| 5 | 100 | 150 |
| 6 | 200 | 300 |
| 7 | 300 | 350 |
| 9 | 300 | 2500 |

TABLE 4

| Sample No. | Gas flow ratio | Inner pressure (Torr) | Substrate temperature (°C.) | $I_{C2}/I_{CH}$ | ED | XD | Surface flatness (RMS Å) | Hydrogen content (atm %) | Density (g/cm³) | Total evaluation |
|---|---|---|---|---|---|---|---|---|---|---|
| 10 | C₂H₄/H₂/HCl = 2/1/0.1 | 5 × 10⁻⁴ | 350 | 0.08 | | | no film was formed | | | x |
| 11 | C₂H₄/H₂/HCl = 2/1/0.1 | 5 × 10⁻³ | " | 0.1 | D | amorphous | 70 | 20 | 1.8 | Δ |
| 12 | CH₃OH/H₂/HF = 1/19/0.1 | 1 | 590 | 0.3 | D | D | 150 | 10 | 2.0 | ○ |
| 13 | CH₃OH/H₂ = 1/19 | 10 | 700 | 0.1 | D | D | 500 | 5 | 2.4 | ○ |
| 14 | CH₃OH/H₂ = 1/19 | 50 | " | 0.1> | D | D | 3000 | 2 | 2.7 | Δ |
| 15 | C₂H₄/H₂ | 1 | 650 | 5.1 | D, G | G | 200 | 7 | 1.6 | Δ |

TABLE 4-continued

| Sample No. | Gas flow ratio | Inner pressure (Torr) | Substrate temperature (°C.) | $I_{C2}/I_{CH}$ | ED | XD | Surface flatness (RMS Å) | Hydrogen content (atm %) | Density (g/cm³) | Total evaluation |
|---|---|---|---|---|---|---|---|---|---|---|
| | = 2/1 | | | | | | | | | |
| 16 | $C_2H_4/H_2$ = 1/2 | " | " | 3.5 | D | D | 200 | 7 | 1.7 | Δ |
| 17 | $C_2H_4/H_2$ = 1/15 | " | " | 0.8 | D | D | 180 | 8 | 2.0 | ◯ |

Note: Samples Nos. 10, 11, 14, 15 and 16 are all comparative examples.
◉: Excellent
◯: Good
Δ: Inferior
x: Very much inferior or not possible to form a film

TABLE 5

| Sample No. | Electric resistance (Ω · cm) immediately after film formation | after heating test |
|---|---|---|
| 11 | $10^9$ | $10^6$ |
| 12 | $10^{11}$ | $10^{11}$ |
| 13 | $10^{11}$ | $10^{11}$ |

TABLE 5-continued

| Sample No. | Electric resistance (Ω · cm) immediately after film formation | after heating test |
|---|---|---|
| 15 | $10^3$ | $10^{-1}$ |
| 16 | $10^7$ | $10^5$ |
| 17 | $10^{10}$ | $10^9$ |

TABLE 6

| Sample No. | Microwave power (W) | Substrate temperature (°C.) | $I_{C2}/I_{CH}$ | XD | Surface flatness (RMS Å) | Hydrogen content (atm %) | Density (g/cm³) | Total evaluation |
|---|---|---|---|---|---|---|---|---|
| 18 | 1200 | 450 | 0.7 | D | 250 | 7 | 2.1 | ◉ |
| 19 | 800 | " | 0.5 | D | 350 | 12 | 2.0 | ◯ |
| 20 | 400 | " | 0.1 | amorphous | 80 | 30 | 1.3 | Δ |
| 21 | 200 | " | ~0 | | no film was formed | | | x |
| 22 | " | 250 | ~0 | amorphous | 50 | 60 | 1.1 | x |

Note: Samples Nos. 20, 21 and 22 are all comparative examples.
◉: Excellent
◯: Good
Δ: Inferior
x: Very much inferior or not possible to form a film

TABLE 7

| Sample No. | Intensity of magnetic field at the possition where microwave introducing window is placed | Position of the substrate | Inner pressure (Torr) | Substrate temperature (°C.) | $I_{C2}/I_{CH}$ | XD | Surface flatness (RMS Å) | Hydrogen content (atm %) | Density (g/cm³) | Total evalution |
|---|---|---|---|---|---|---|---|---|---|---|
| 23 | 1500 | 1000 | 0.5 | 580 | 0.5 | D | 250 | 12 | 2.0 | ◯ |
| 24 | " | 875 | " | " | 0.7 | D | 250 | 15 | 2.2 | ◯ |
| 25 | " | 700 | " | " | 0.02 | amorphous | 150 | 25 | 1.6 | x |
| 26 | 875 | 875 | " | " | 0.4 | D | 200 | 20 | 2.2 | ◯ |
| 27 | 700 | 900 | " | " | —(*) | | no film was formed | | | x |
| 28 | " | 500 | " | " | —(*) | • | no film was formed | | | x |

(*): No measurement could be conducted because of unstable plasma.
Note: Samples Nos. 25, 27 and 28 are all comparative examples.
◉: Excellent
◯: Good
Δ: Inferior
x: Very much inferior or not possible to form a film

TABLE 8

| Sample No. | Inner pressure (Torr) | Intensity of magnetic field at the possition where microwave introducing window is placed (Gauss) | Position of the substrute **(mm) | Intensity of magnetic field near or round the substrate (Gauss) | $I_{C2}/I_{CH}$ | XD | Surface flatness (RMS Å) | Hydrogen content (atm %) | Density (g/cm³) | Total evaluation |
|---|---|---|---|---|---|---|---|---|---|---|
| 29 | 0.5 | 1800 | 5 | 1800 | —(*) | | no film was formed | | | x |
| 30 | " | " | 10 | 1750 | 0.8 | D | 450 | 6 | 2.0 | ◯ |
| 31 | " | " | 100 | 1500 | 0.7 | D | 350 | 7 | 2.0 | ◯ |
| 32 | " | " | 220 | 875 | 0.8 | D | 250 | 7 | 2.0 | ◯ |
| 33 | " | " | 250 | 600 | ~0 | amorphous | material comprieing soots | | | x |
| 34 | 0.05 | 2000 | 250 | 1800 | 0.5 | " | 250 | 20 | 1.8 | ◯ |

TABLE 8-continued

| Sample No. | Inner pressure (Torr) | Intensity of magnetic field at the possition where microwave introducing window is placed (Gauss) | Position of the substrute **(mm) | Intensity of magnetic field near or round the substrate (Gauss) | $I_{C2}/I_{CH}$ | XD | Surface flatness (RMS Å) | Hydrogen content (atm %) | Density (g/cm³) | Total evaluation |
|---|---|---|---|---|---|---|---|---|---|---|
| 35 | " | " | 500 | 875 | 0.1 | " | 200 | 17 | 1.8 | ○ |

(*): No measurement could be conducted because of unstable plasma.
**: Distance from the microwave introducing window.
Note: Samples Nos. 29 and 33 are all comparative examples.
◎: Excellent
: Good
Δ: Inferior
x: Very much inferior or not possible to form a film

What is claimed is:

1. A diamond-like carbon film having diamond crystalline phases and including hydrogen atoms in an amount of no greater than about 20 atomic %; wherein the density of said film being at least 1.8 g/cm³, said diamond-like carbon film being formed on a substrate by the process comprising:
   (i) simultaneously (a) applying a magnetic field and microwave energy to a raw mat®rial gas capable of supplying carbon atoms and hydrogen atoms to form a plasma from said raw material gas having (i) C₂ active species and (ii) CH active species and (b) maintaining a pressure of $1 \times 10^{-2}$ to 10 Torr so as to provide a ratio of plasma emission spectrum strength IC₂ due to said C₂ active species to the plasma emission $I_{CH}$ due to said CH active species from $5 \geq I_{C2}/I_{CH} \geq 0.05$ and (ii) maintaining the temperature of said substrate from 350° to 700° C., whereby an even surfaced, etch-resistant diamond-like film which is chemically and structurally stable even at high temperature conditions is formed on said substrate.

2. A process for producing a diamond-like carbon film having diamond crystalline phases and including hydrogen atoms in an amount no greater than about 20 atomic %; wherein the density of said film being at least 1.8 g/cm³, said diamond-like carbon film being formed on a substrate by the process comprising:
   (i) simultaneously (a) applying a magnetic field and microwave energy to a raw material gas capable of supplying carbon atoms and hydrogen atoms to form a plasma from said raw material gas having (i) C₂ active species and (ii) CH active species and (b) maintaining a pressure of $1 \times 10^{-2}$ to 10 Torr so as to provide a ratio of plasma emission spectrum strength IC₂ due to said C₂ active species to the plasma emission $I_{CH}$ due to said CH active species from $5 \geq I_{C2}/I_{CH} \geq 0.05$ and (ii) maintaining the substrate temperature at 350° to 700° C., whereby an even-surfaced, etch resistant, diamond-like film which is chemically and structurally stable even at high temperature conditions is formed on said substrate.

3. The process according to claim 2, wherein the magnetic field is of sufficient intensity to satisfy electron resonating conditions.

4. The process according to claim 3, wherein the microwave energy is applied at a frequency of 2.45 GHz, and the intensity of said magnetic field is at least 875 gauss.

* * * * *

UNITED STATES PATENT AND TRADEMARK OFFICE
CERTIFICATE OF CORRECTION

PATENT NO. : 4,935,303
DATED : June 19, 1990
INVENTOR(S) : KEIKO IKOMA, ET AL.

Page 1 of 4

It is certified that error appears in the above-identified patent and that said Letters Patent is hereby corrected as shown below:

ON THE TITLE PAGE:

IN [56] REFERENCES CITED

Attorney, Agent, or Firm: "Fitzpatrick, Cella Harper & Scinto" should read --Fitzpatrick, Cella, Harper & Scinto--.

COLUMN 1

Line 24, "spattering" should read --sputtering--.
    Line 25, "spattering" should read --sputtering--.
    Line 52, "low, the" should read --low, and the--.
    Line 54, "spattering" should read --sputtering--.
    Line 55, "spattered" should read --sputtered--.
    Line 56, "spattering" should read --sputtering--.
    Line 57, "spattering" should read --sputtering--.
    Line 59, "spattered" should read --sputtered-- and "spattering" should read --sputtering--.

COLUMN 3

Line 45, "a" should read --an--.
    Line 51, "stable" should read --stably--.
    Line 67, "realized" should read --been realized--.

COLUMN 5

Line 13, "case" should read --cause--.

UNITED STATES PATENT AND TRADEMARK OFFICE
CERTIFICATE OF CORRECTION

PATENT NO. : 4,935,303
DATED : June 19, 1990
INVENTOR(S) : KEIKO IKOMA, ET AL.

It is certified that error appears in the above-identified patent and that said Letters Patent is hereby corrected as shown below:

COLUMN 6

Line 5, "an" should read --a--.
    Line 50, "suitable" should read --suitably--.

COLUMN 7

Line 22, "tresting" should read --testing--.
    Line 54, "transmitted" should read --be transmitted--.

COLUMN 8

Line 49, "was" should read --did--.
    Line 50, "took" should read --take--.

COLUMN 9

Line 20, "used" should read --use--.
    Line 46, "Reference 5 indicate" should read
        --Reference numeral 5 indicates--.

COLUMN 11

Line 4, "guage." should read --gauge.--.

COLUMN 12

Line 45, "penetorator 122" should read --penetrator 122--.

UNITED STATES PATENT AND TRADEMARK OFFICE
CERTIFICATE OF CORRECTION

PATENT NO. : 4,935,303
DATED : June 19, 1990
INVENTOR(S) : KEIKO IKOMA, ET AL.

It is certified that error appears in the above-identified patent and that said Letters Patent is hereby corrected as shown below:

COLUMN 13

TABLE 2, " : Excellent   should      -- ●: Excellent
         : Good    "     read          ○: Good --.

COLUMN 15

TABLE 7, "possition" should read --position-- and "substrute" should read --substrate--.

TABLE 8, "possition" should read --position--; "substrute" should read --substrate-- and comprieing should read --comprising--.

COLUMN 17

TABLE 8-continued, "possition" should read --position--; "substrute" should read --substrate-- and " : Good" should read -- ○: Good--.

Line 22, "mat®rial" should read --material--.
Line 30, "IC$_2$" should read --I$_{c2}$--.
Line 32, "even surfaced" should read --even-surfaced--.

UNITED STATES PATENT AND TRADEMARK OFFICE
CERTIFICATE OF CORRECTION

PATENT NO. : 4,935,303
DATED : June 19, 1990
INVENTOR(S) : KEIKO IKOMA, ET AL.

Page 4 of 4

It is certified that error appears in the above-identified patent and that said Letters Patent is hereby corrected as shown below:

COLUMN 18

Line 28, "etch resistant" should read --etch-resistant--.

Signed and Sealed this

Thirteenth Day of October, 1992

Attest:

DOUGLAS B. COMER

Attesting Officer

Acting Commissioner of Patents and Trademarks